United States Patent [19]

Redfern

[11] Patent Number: 5,329,184

[45] Date of Patent: Jul. 12, 1994

[54] METHOD AND APPARATUS FOR FEEDBACK CONTROL OF I/O CHARACTERISTICS OF DIGITAL INTERFACE CIRCUITS

[75] Inventor: Thomas P. Redfern, San Jose, Calif.

[73] Assignee: National Semiconductor Corporation, Santa Clara, Calif.

[21] Appl. No.: 972,134

[22] Filed: Nov. 5, 1992

[51] Int. Cl.$^5$ .......................... H03K 3/01; H03K 9/092
[52] U.S. Cl. .................................. 307/475; 307/296.8; 307/270; 307/296.5
[58] Field of Search ...................... 307/475, 270, 296.8, 307/296.5

[56] References Cited

U.S. PATENT DOCUMENTS

| | | | |
|---|---|---|---|
| 4,555,642 | 11/1985 | Morales | 307/296.8 |
| 4,563,595 | 1/1986 | Bose | 307/296.8 |
| 4,642,488 | 2/1987 | Parker | 307/296.8 |
| 4,763,021 | 8/1988 | Stickel | 307/296.8 |
| 4,837,460 | 6/1989 | Uchida | 307/296.8 |
| 5,235,222 | 10/1993 | Kondoh et al. | 307/296.8 |
| 5,268,599 | 12/1993 | Matsui | 307/296.8 |

Primary Examiner—Edward P. Westin
Assistant Examiner—Richard Roseen
Attorney, Agent, or Firm—Flehr, Hohbach, Test, Albritton & Herbert

[57] ABSTRACT

A transceiver network having a driver and a receiver circuit for providing an interface between, for example, a data bus and a system controller or the like is disclosed herein. The receiver circuit includes a first logic gate of a first predefined type for providing output signals in response to input signals in accordance with a first transfer characteristic governed by a first reference voltage. A compensation arrangement is provided for adjusting the first reference voltage, and includes a first compensation gate of the first predefined type having an output governed by the first reference voltage. A first feedback loop coupled to the first compensation gate's output varies the first reference voltage until the first compensation gate generates a predefined output signal. The driver network includes a second input logic gate of a second predefined type having a first current transfer characteristic governed by a gate control voltage. A second compensation arrangement adjusts the gate control voltage, and includes a second compensation gate of the second predefined type having a current transfer characteristic proportional to the first current transfer characteristic. A second feedback loop coupled to the second compensation gate varies the gate control voltage until current flowing through the second compensation gate matches a supply current.

9 Claims, 5 Drawing Sheets

METHOD AND APPARATUS FOR FEEDBACK CONTROL OF I/O CHARACTERISTICS OF DIGITAL INTERFACE CIRCUITS

The present invention relates generally to digital circuits for providing an interface to a data bus or the like, and particularly to methods and systems for controlling the switching characteristics of such circuits.

BACKGROUND OF THE INVENTION

As is well known, communication between digital circuits is often facilitated by a digital data bus consisting of a plurality of individual bit lines. Digital circuits utilizing a data bus generally communicate therewith by way of a plurality of line transceivers, with each transceiver being connected to a separate bit line through a bonding pad. Each line transceiver typically includes a receiver for conveying information from the bit line to a host circuit (e.g., a microprocessor) and a driver for impressing signals generated by the host circuit upon the bonding pad.

Conventional line receivers essentially operate as logic gates having well-defined input thresholds. A logical low is recognized in response to signals from the bit line less than the input threshold, while the line receiver recognizes a logical high upon receipt of signals from the bit line larger than the input threshold. The input threshold is typically controlled by a differential comparator having a first input connected to the bonding pad, and a second input connected to a reference voltage equivalent in magnitude to the threshold voltage.

Unfortunately, a number of difficulties are associated with such conventional differential input stages. For example, the process of converting a two-element differential input to provide a single logic level tends to degrade bandwidth. In addition, since a differential comparator is a linear circuit, a portion of the current which would otherwise be available for logic level switching is used to bias the differential stage. Moreover, larger devices are needed to increase switching speed since the time required by a differential comparator to switch between logic states is proportional to a quiescent bias current. This mode of increasing switching speed is limited, however, due to the increased parasitic capacitance associated with comparators incorporating such larger devices.

A standard two-transistor CMOS inverter provides an alternative which overcomes certain of the drawbacks associated with differential input stages. For example, the single-input design of a CMOS inverter does not engender a loss in bandwidth. In addition, since CMOS inverters do not require a quiescent bias current switching speed may be enhanced without causing an increase in parasitic capacitance. However, the input threshold voltage of the CMOS inverter is influenced by changes in parameters such as processing, temperature and power supply. Accordingly, it would be advantageous to provide a CMOS line receiver having a switching threshold substantially invariant to the parameter variation that tends to adversely affect conventional inverters.

Standard line drivers generally include a bipolar transistor having a collector terminal coupled to the bonding pad through a Schottky diode, with the bonding pad being coupled to a supply voltage through an external termination resistor. The Schottky diode increases the size of the driver, but is required in order to isolate the large capacitance of the bipolar transistor from the bit line. A logical low is impressed upon the bonding pad as a consequence of the bias current flowing through the termination resistor upon actuation of the transistor. When the transistor is turned off the bonding pad rises to the power supply voltage.

Although bipolar line drivers perform satisfactorily in certain applications, it would be advantageous to provide a CMOS implementation so as to enable direct integration of the line driver with other CMOS circuitry. Such integration would obviate the need to simultaneously realize bipolar and CMOS elements upon a single semiconductor chip through bi-CMOS implementations, which tend to be expensive and to consume relatively large areas.

However, in addition to the operating parameter variability described above with respect to CMOS line receivers, still other difficulties hinder potential CMOS implementations of line drivers. Since an MOS transistor behaves similarly to a resistor when turned on, the magnitude of the logical low impressed upon the bonding pad will be a strong function of transistor bias current. In addition, the current drive capability per unit area for MOS transistors is generally less than that of bipolar transistors.

It is thus another object of the present invention to provide a CMOS line driver having a switching threshold substantially invariant to parameter variation, and which is capable of providing a relatively stable logical low output signal.

SUMMARY OF THE INVENTION

In summary, the present invention is a transceiver network having a driving and a receiver circuit for providing an interface between, for example, a data bus and a system controller or the like. The receiver circuit includes a first logic gate of a first predefined type for providing output signals in response to input signals in accordance with a first transfer characteristic governed by a first reference voltage. A compensation arrangement is provided for adjusting the first reference voltage, and includes a first compensation gate of the first predefined type having an output governed by the first reference voltage. A first feedback loop coupled to the first compensation gate's output varies the first reference voltage until the first compensation gate generates a predefined output signal.

The driver network includes a second input logic gate of a second predefined type having a first current transfer characteristic governed by a gate control voltage. A second compensation arrangement adjusts the gate control voltage, and includes a second compensation gate of the second predefined type having a current transfer characteristic proportional to the first current transfer characteristic. A second feedback loop coupled to the second compensation gate varies the gate control voltage until current flowing through the second compensation gate matches a supply current.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
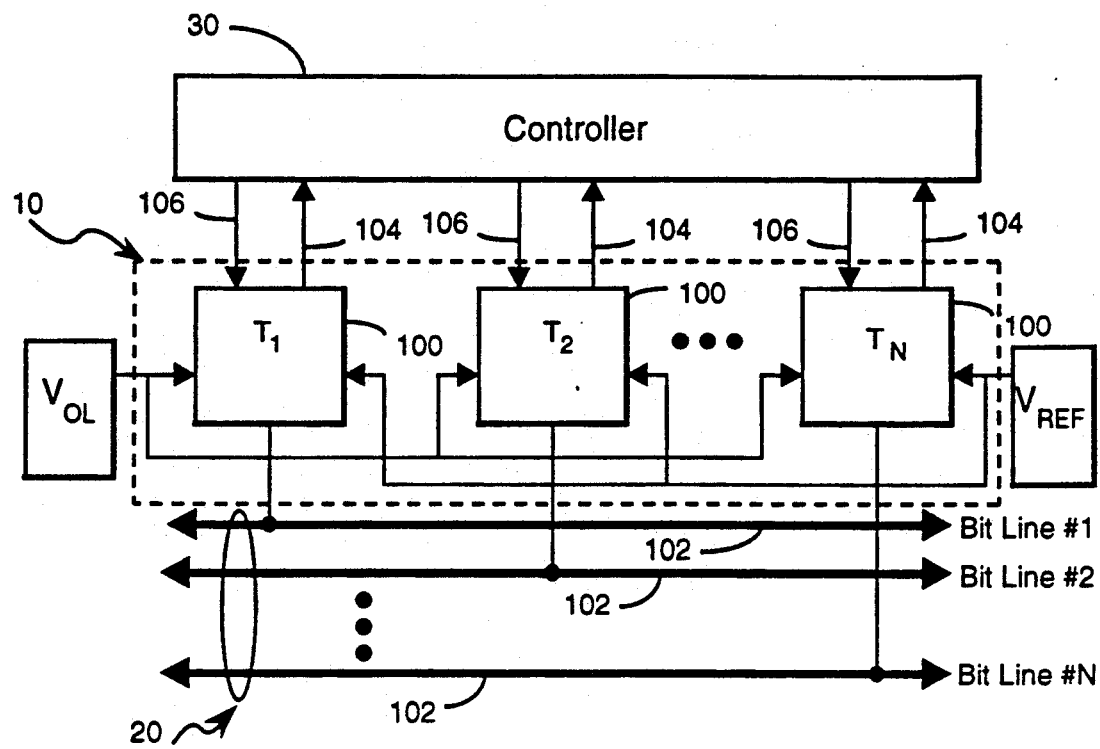
FIG. 1 shows a block diagrammatic representation of an array of transceivers of the present invention.

Referring to FIG. 1, transceiver array 10 provides an interface between an N-bit data bus 20 and, for example, a digital processor or controller 30. The transceiver array 10 includes a set of N transceivers ($T_n$) 100, with each transceiver 100 being connected to a bit line 102 of the data bus 20. Each transceiver 100 is connected to a threshold voltage reference $V_{REF}$ and to a logic low reference voltage $V_{OL}$ externally supplied by, for example, conventional precision voltage reference circuits such as bandgap references or the like.

As is described hereinafter, when the controller 30 is operative in a data read mode information carried by the data bus 20 is supplied thereto through a set of N data lines 104 driven by the transceivers 100. Similarly, when the controller 30 is operative in a transmit mode the transceivers 100 drive the bit line 102 in accordance with a control word asserted on lines 106 by the controller 30.

Figure 2:
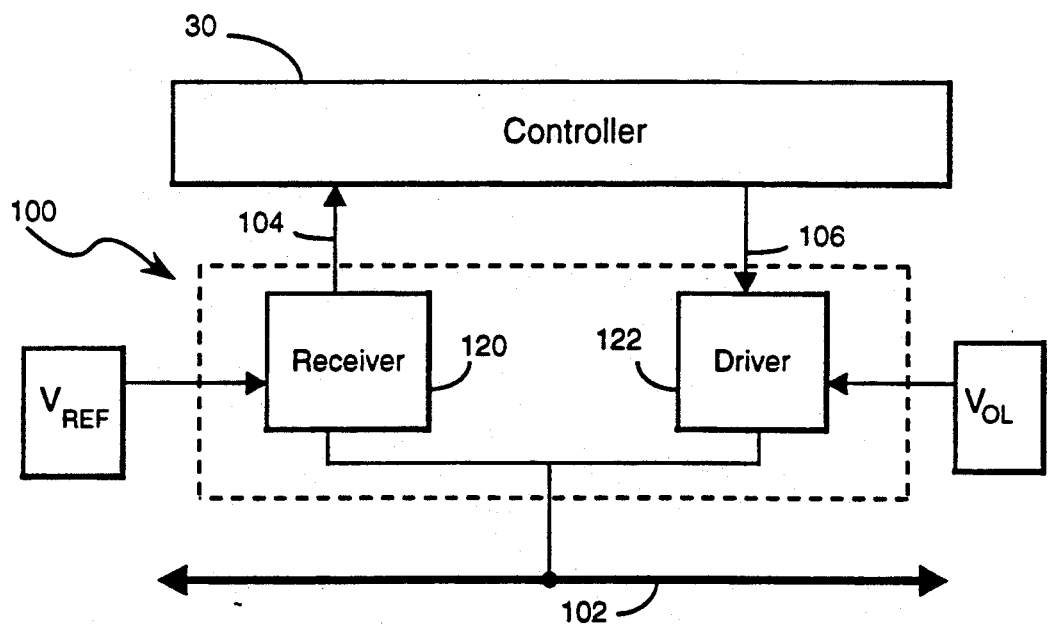
FIG. 2 depicts a simplified block diagrammatic representation of a preferred embodiment of one of the transceivers included within the array of FIG. 1.

As shown in FIG. 2, each transceiver 100 includes a receiver interface circuit 120 and a driver interface circuit 122 commonly connected to one of the bit lines 102 of the data bus 20. The receiver circuit 120 is referenced to the threshold voltage $V_{REF}$, while the driver circuit 122 utilizes the logic low reference $V_{OL}$. When the controller 30 is in the read mode the receiver circuit 120 identifies voltages on the bit line 102 less than $V_{REF}$ as logically low, and greater than $V_{REF}$ as logically high. The result of this identification is forwarded to the controller 30 on data line 104. During the transmit mode operation of the controller 30 the driver circuit 122 impresses either a logically high or low voltage upon the bit line 102 in accordance with a control bit asserted on line 106.

Figure 3:
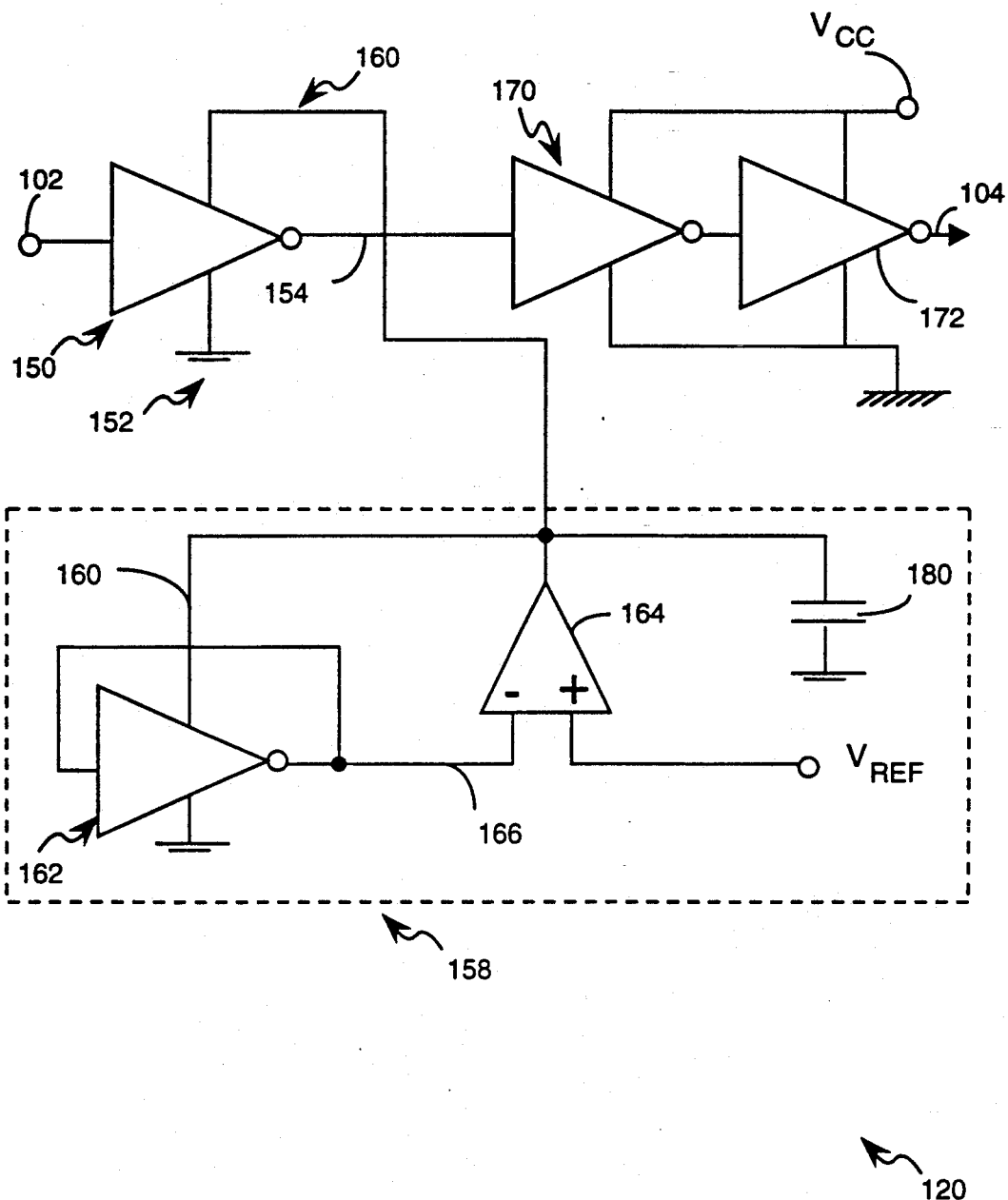
FIG. 3 shows a preferred implementation of a receiver circuit included within the transceiver of the present invention.

Referring to FIG. 3, there is shown a preferred implementation of the receiver circuit 120. The receiver circuit 120 includes an input inverter 150 addressed by one of the bit lines 102, where the voltage on the bit line 102 is defined relative to an input ground terminal 152. The inverter 150 generates a voltage corresponding to a logical high ($V_{CC}$) at the output 154 thereof in response to data voltages on the bit line 102 less than a trip point of the inverter 150, and presents a logically low voltage at output 154 when addressed by data voltages larger than the trip point. It is well known that the trip point of an inverter corresponds to that voltage which when applied to the input of an inverter results in an identical output voltage being generated thereby. As is described hereinafter, a compensation network 158 of the receiver 120 operates to adjust a reference supply voltage on node 160 provided to the inverter 150 such that the trip point thereof is made to be substantially independent of variation in temperature, power supply and semiconductor processing.

As shown in FIG. 3, the compensation network 158 includes a compensation inverter 162 having an input/output transfer characteristic substantially identical to that of the input inverter 150. This identity may be effected by, for example, realizing the inverters 150 and 162 using identical circuit elements on a single integrated circuit with conventional CMOS processing techniques, or by using a second inverter 162 whose two components have the same gate size ratio as do the circuit elements in inverter 150.

Figure 4:
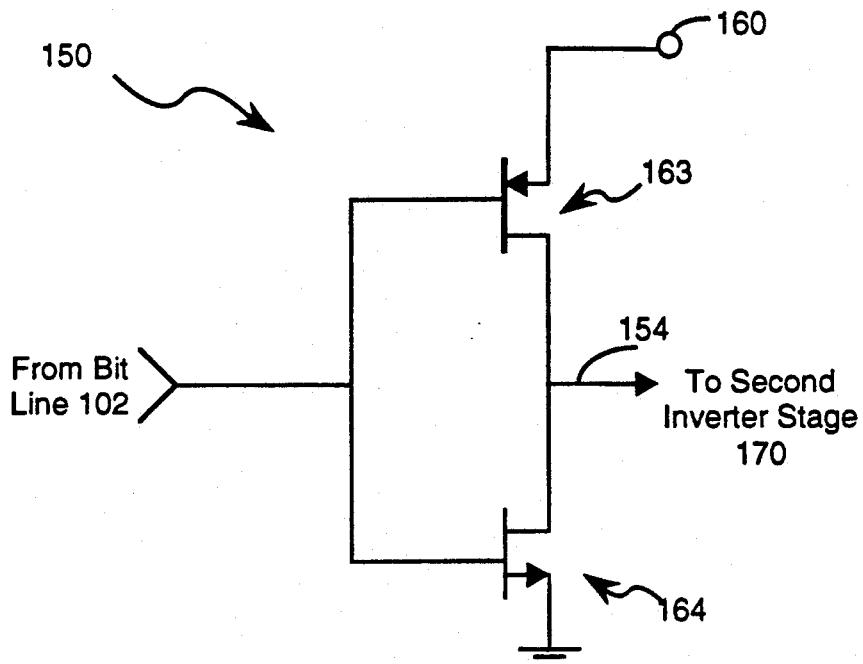
FIG. 4 shows a schematic representation of a CMOS implementation of an input inverter included within the receiver circuit of FIG. 3.

Referring temporarily to FIG. 4, there is shown a schematic representation of a CMOS implementation of the input inverter 150, in which is incorporated a p-channel MOS transistor 163 and an n-channel MOS transistor 164. The gate terminals of the MOS transistors 163 and 164 are commonly connected to the bit line 102, or alternatively are coupled to a bonding pad (not shown) in electrical contact with the bit line 102. In addition, the source of the p-channel MOS transistor 163 is connected to the reference supply voltage on node 160 while the source of the n-channel MOS transistor 164 contacts input ground 152. The inverter output node 154 is connected to the drain of transistors 163 and 164.

Figure 5:
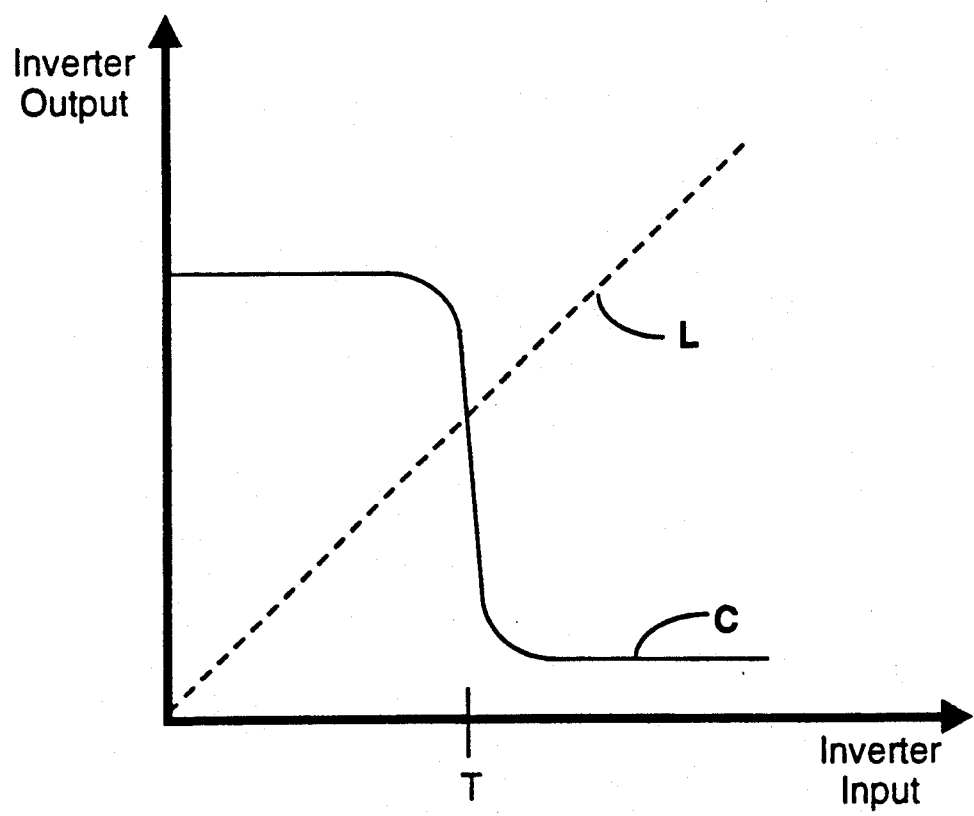
FIG. 5 is a graphical representation of the transfer characteristic of the input inverter and of a substantially identical compensation inverter.

FIG. 5 provides a graphical representation of the transfer characteristic C of the inverters 150 and 162. Since the input and output ports of the compensation inverter 162 are commonly connected as represented by load line L, the trip point T of the compensation inverter 162 will always be defined by the intersection of the load line L and transfer characteristic C. The compensation network 158 (FIG. 3) operates to fix the trip point T of the compensation inverter at the reference voltage $V_{REF}$ by appropriately adjusting the reference supply voltage on node 160 used to bias the compensation inverter 162. In particular, a feedback loop consisting of an output line 166 of the compensation inverter 162 and a differential amplifier 164 operate to force the trip point of the inverter to $V_{REF}$ through control of the reference supply voltage on node 160.

Again referring to FIG. 3, a non-inverting terminal of the differential amplifier 164 is connected to the reference voltage $V_{REF}$ while the inverter output line 166 drives the inverting terminal thereof. Hence, the differential amplifier 164 operates to set the reference voltage on node 160 such that the input and output of the compensation inverter, and consequently the trip point thereof, are fixed at $V_{REF}$.

Since the input inverter 150 and compensation inverter 162 are identical and are identically biased by the reference supply voltage on node 160, the trip point of the input inverter 150 is also fixed at $V_{REF}$. Specifically, the reference voltage on node 160 is forced by the compensation network 158 to be of a value such that when the input inverter 150 is driven with an input voltage equal to $V_{REF}$, the voltage $V_{REF}$ will be provided at the inverter output 154. In this way the precision of the trip point of the input inverter 150 is primarily dependent only upon the stability of the reference voltage $V_{REF}$ supplied to the differential amplifier 164. In the preferred implementation of FIG. 3 a highly stable bandgap reference or the like will generally be utilized to provide a reference voltage $V_{REF}$ substantially unaffected by perturbations in temperature or power supply.

Again referring to FIG. 3, second and third inverter stages 170 and 172 are designed to have a trip point approximately equal to $V_{REF}$ when biased at a voltage of $V_{CC}$. For example, in CMOS implementations where $V_{REF}$ is selected to be $V_{CC}/2$ the p-channel and n-channel MOS transistors included within the second and third inverter stages 170 and 172 are designed to be of equal transconductance (which will typically require the p-channel transistor to be two to three times the size of the n-channel transistor). For selections of $V_{REF}$ at other fractions of $V_{CC}$ the relative dimensions of the p-channel and n-channel transistors may be modified accordingly.

The second and third inverter stages 170 and 172 serve to augment the voltage gain of the receiver 120, with any variation in the trip point of the inverter 170 with respect to the input voltage on node 102 being reduced by the gain of the compensated input inverter 150. If such a reduction in variation of the trip point of inverter 170 is insufficient, the reference voltage on node 160 may also be used to bias the second inverter stage 170 (in which case the compensation inverter 162 in the compensation circuit 158 would have to be replaced with a chain of two compensation inverters matching inverters 150 and 170, respectively). In this case variation in the trip point of the third inverter stage 172 with respect to the input voltage on node 102 would be effectively reduced by the product of the gains of the compensated inverter stages 150 and 170.

The compensation network 158 could be employed to simultaneously provide the reference voltage on node 160 to an array of input inverters driven by other bit lines 102 included within the data bus 120. The number of input inverters potentially included within such an array depends upon the current drive capability of the differential amplifier 164. In this regard the compensation network 158 includes a bypass capacitor 180 for minimizing any potential variation in the reference voltage on node 160 occurring when current is drawn from the differential amplifier 164 during switching of any of the input inverters included within the array.

As mentioned in the Background of the Invention, the voltage drop across MOS devices has provided an obstacle to development of line drivers using MOS technology. Specifically, since an MOS transistor behaves similarly to a resistor when turned on, the magnitude of logically low values tapped from the drain terminal thereof will be a strong function of transistor bias current.

Figure 6:
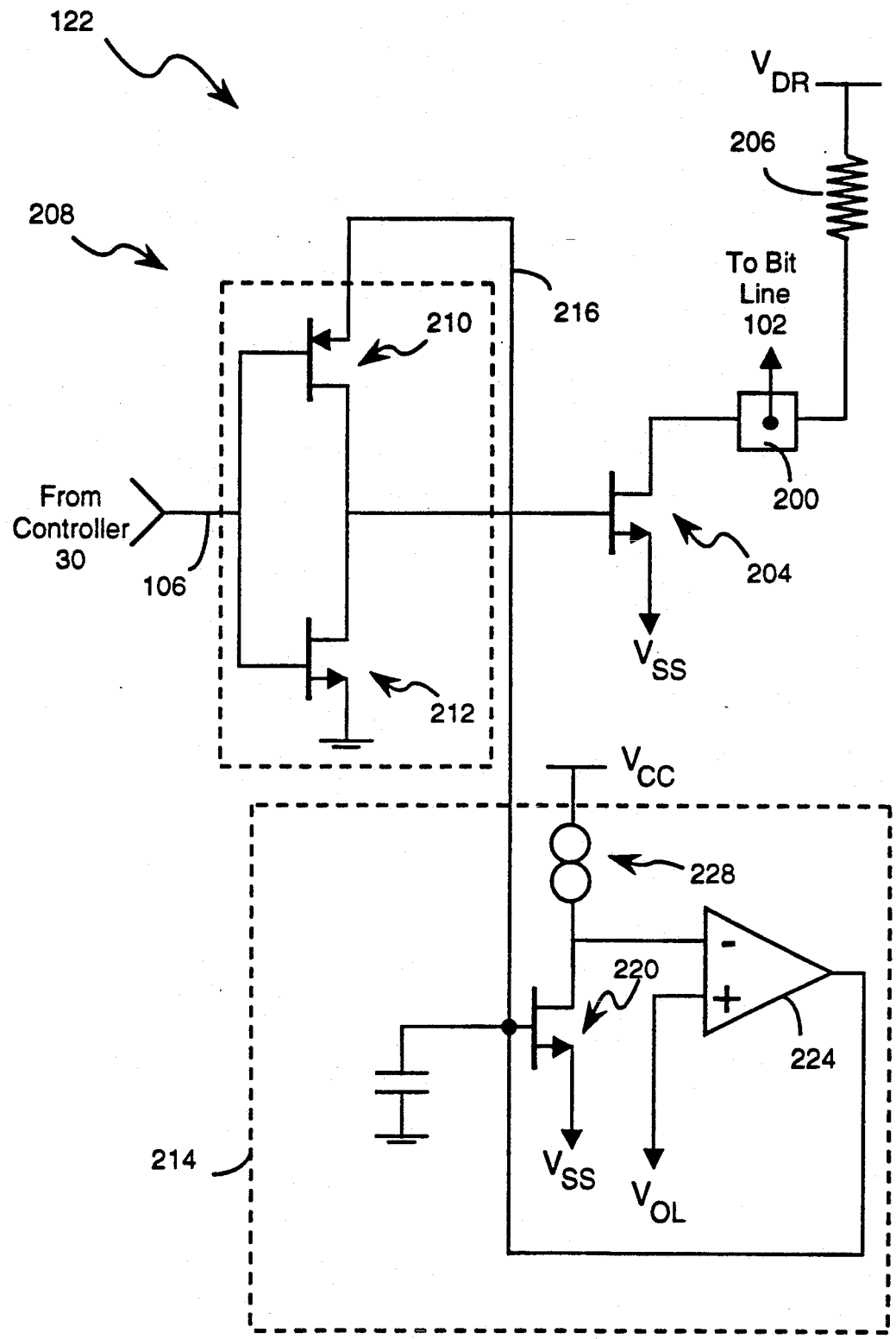
FIG. 6 depicts a preferred MOS implementation of a driver circuit designed included within the transceiver of the present invention.

Referring to FIG. 6, there is shown a preferred MOS implementation of the driver circuit 122 designed to impress relatively precise logical voltages upon a bonding pad 200 in accordance with a control bit asserted on line 106. The driver circuit 122 includes an MOS driver transistor 204 having a source terminal coupled to a negative supply voltage $V_{SS}$, and a drain terminal connected to the bonding pad 200, with the pad 200 being coupled to a driver bias voltage VDR through termination resistor 206. An input transistor switch network 208 includes input p-channel and n-channel MOS transistors 210 and 212 having gate terminals commonly addressed by the control bit asserted on line 106.

When the control bit asserted on line 106 is high, transistor 212 becomes conductive and thereby turns off the driver transistor 204. This results in the bonding pad 200 rising to the voltage VDR (i.e., a logical high). In contrast, when the control bit asserted on line 106 assumes a low data value, a compensation voltage present on a feedback line 216 is applied to the gate of driver transistor 204 through the MOS transistor 210. As is described hereinafter, the compensation voltage is adjusted by a compensation network 214 such that the logic low voltage $V_{OL}$ is impressed upon the bonding pad 200 when the driver transistor 204 is rendered conductive.

As shown in FIG. 6, the compensation network 214 includes a compensation transistor 220 dimensioned in predefined proportion relative to the driver transistor 204. For example, in a particular implementation the compensation transistor 220 may be characterized by a channel width to length ratio of W/L, and the driver transistor 204 characterized by a width to length ratio of NW/L. Hence, when the current conducted by the compensation transistor 220 is equivalent to approximately (1/N) of that conducted by the driver transistor 204 the drain voltages of each will be substantially identical. This correspondence forms the basis for the manner in which the compensation network 214 regulates the gate voltage of the driver transistor 204 in order to stabilize the magnitude of the logic low voltage $V_{OL}$ impressed on the bonding pad 200.

Referring to FIG. 6, the compensation transistor 220 and a differential amplifier 224 define a feedback loop operative to force the drain voltage of the compensation transistor 220 to the value $V_{OL}$. In this regard the differential input applied to amplifier 224 consists of the precision reference voltage $V_{OL}$, generally synthesized by a bandgap reference or the like, together with the drain voltage of the compensation transistor 220. Since the driver transistor 204 is larger than the compensation transistor 220 by a factor of N, a current source 228 is scaled to provide a current less than a predefined current $I_{OL}$ by the factor N. The predefined current $I_{OL}$ corresponds to that conducted by the driver transistor 204 when its drain voltage is $V_{OL}$.

For example, if it is desired that $I_{OL}$ be approximately 80 mA for a $V_{OL}$ of 0.95 Volts, choosing the scaling factor N to have a value of 80 mandates that the current source 228 provide 1 mA to the compensation transistor 220. In this way the feedback loop consisting of the amplifier 224 and the compensation transistor 220 adjusts the feedback voltage on line 216 so that the drain voltage of transistor 220 is forced to $V_{OL}$ when the current source 228 is set to 1 mA. Since feedback line 216 also addresses the gate of the driver transistor 204 when input transistor 210 is conductive, the voltage on bonding pad 200 is also forced to $V_{OL}$ as a consequence of the current scaling described above.

Figure 7:
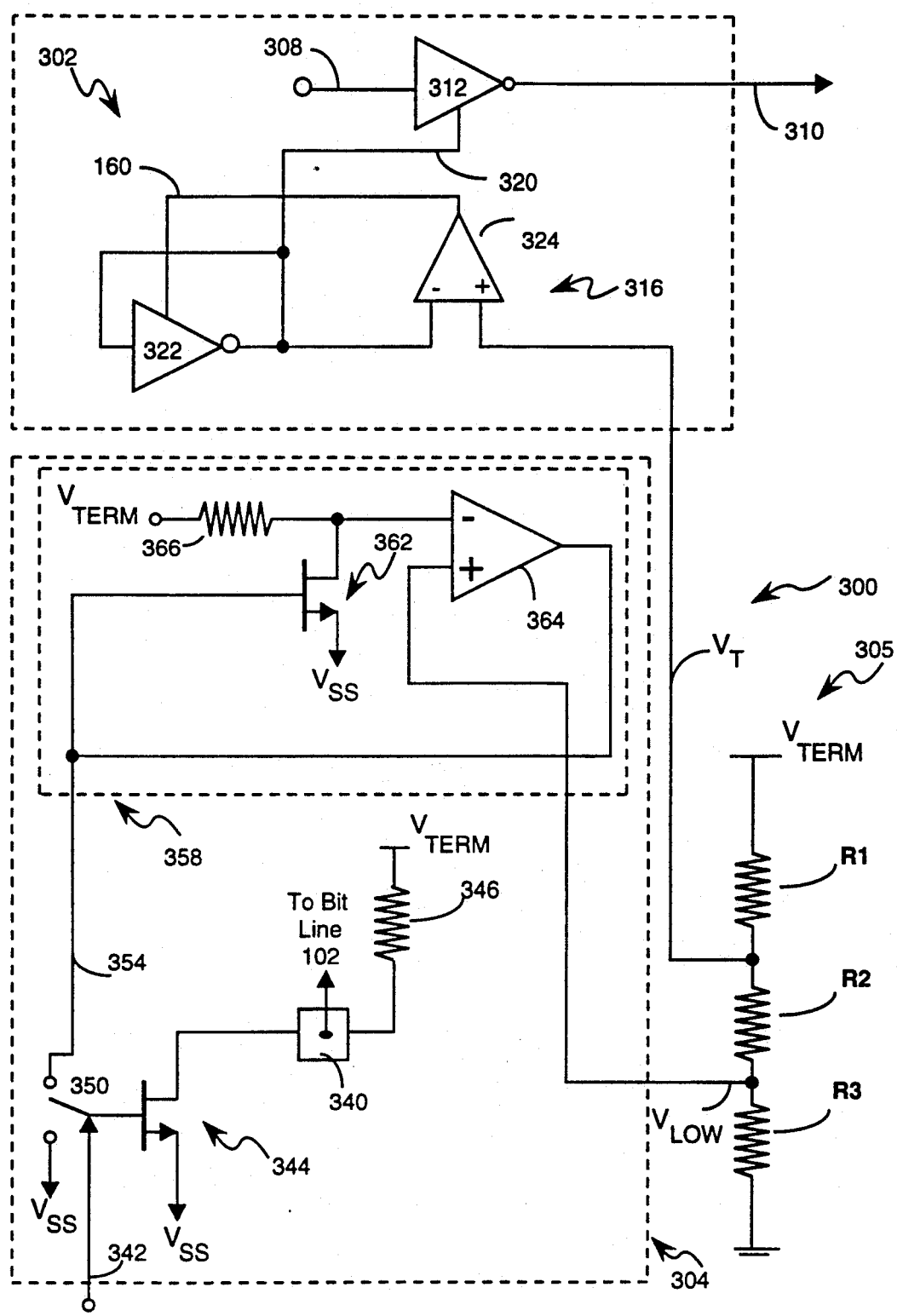
FIG. 7 illustrates an alternatively preferred embodiment of the transceiver of the present invention.

FIG. 7 depicts a preferred embodiment of the transceiver 300 of the present invention in which is incorporated a receiver network 302 and a driver network 304. It is a feature of the transceiver 300 that the voltage differential between an input switching threshold $V_T$ and a logic low voltage $V_{LOW}$, with respect to which $V_T$ will preferably be referenced, is substantially independent of the absolute precision of an externally supplied termination voltage reference $V_{TERM}$. This is effected by tapping the voltages $V_T$ and $V_{LOW}$ from a resistive ladder 305 having a set of three resistors R1, R2, and R3 connected in series. For typical values of $V_{TERM}$ (2.0 to 2.1 Volts) the ladder 305 produces a switching threshold $V_T$ of ($\frac{3}{4}$)$V_{TERM}$, (approximately 1.5 Volts), and a logic low voltage $V_{LOW}$ of ($\frac{1}{2}$)$V_{TERM}$. Since the voltages $V_T$ and $V_{LOW}$ are both derived from the ladder 305, each are induced to change in a substantially identical manner in response to perturbations in the voltage $V_{TERM}$.

The foregoing indicates that the switching threshold $V_T$ is desirably constrained to remain at predefined offsets (i.e., noise margins) from the voltages $V_{TERM}$ and $V_{LOW}$ notwithstanding variation in $V_{TERM}$. As a consequence, the voltage $V_{TERM}$ need not be supplied by a highly precise external source such as a bandgap reference or the like in order to ensure maintenance of acceptable noise margins.

The receiver network 302 operates in substantially the same manner as the receiver 120 (FIG. 3) to identify voltages on bit line 308 less than $V_T$ as logically low, and greater than $V_T$ as logically high. The result of this identification is then forwarded to a digital circuit, such as a controller, on a data line 310. As shown in FIG. 7, the receiver network 302 includes an input inverter 312 addressed by the bit line 308. The inverter 312 generates a voltage corresponding to a logical high ($V_{CC}$) on data line 310 in response to data voltages on the bit line 308 less than the switching threshold $V_T$, and impresses a logically low voltage upon output line 310 when addressed by data voltages larger than the voltage $V_T$.

Again with reference to FIG. 7, the receiver network 302 includes a receiver compensation network 316 disposed to adjust a reference supply voltage on line 320 provided to the inverter 312 such that the trip point thereof remains relatively fixed at the voltage $V_T$ irrespective of variation in temperature, power supply and semiconductor processing. The receiver compensation network 316 operates in a manner substantially identical to that of the compensation network 158 (FIG. 3) to stabilize the trip point of the inverter 312. Accordingly, the compensation network 316 includes a receiver compensation inverter 322 having an input/output transfer characteristic substantially identical to that of the input inverter 312. The inverter 322 drives one input of a differential amplifier 324, while a second input of the amplifier 324 is held at the threshold voltage $V_t$. Again, this configuration results in the compensation inverter 322 being biased by the amplifier 324 such that the trip point of the inverter 322 is held at the threshold voltage $V_T$.

Referring to FIG. 7, the driver network 304 operates to impress logical voltages upon a bonding pad 340 in accordance with a control bit on line 342 externally supplied by, for example, a digital circuit such as a controller (not shown). The driver network 304 includes an MOS driver transistor 344 having a drain terminal connected to the bonding pad 340, with the pad 340 being coupled to the bias voltage $V_{TERM}$ through a driver termination resistor 346 of magnitude $R_{TERM}$. The current through the resistor 346 when the voltage upon the bonding pad 340 is at $V_{OL}$ may be expressed as $(V_{TERM}-V_{OL})/R_{TERM}$, and is hereinafter identified as $I_L$.

When the control bit on line 342 is high, an input transistor switch 350 turns off the driver transistor 344 by applying a suitably low turn-off voltage ($V_{SS}$) to its gate. This results in the bonding pad 340 rising to the logically high value of the voltage $V_{TERM}$. In contrast, when the control bit 342 assumes a low data value a compensation voltage present on a driver feedback line 354 is applied to the gate of driver transistor 344 through the switch 350. As was described above with reference to the driver network 122 depicted in FIG. 6, the compensation voltage is adjusted by a compensation network 358 such that the logic low voltage $V_{LOW}$ is impressed upon the bonding pad 340 when the driver transistor 344 is rendered conductive.

As shown in FIG. 7, the compensation network 358 includes a driver compensation transistor 362 scaled to the physically smaller than the driver transistor 344 by a factor of M. The compensation transistor 362 and a differential amplifier 364 define a feedback loop operative to force the drain voltage of the compensation transistor 362 to the valve $V_{LOW}$. In this regard the differential input applied to amplifier 364 consists of the precision reference voltage $V_{LOW}$ and the drain voltage of the compensation transistor 362. Since the driver transistor 344 is larger than the compensation transistor 362 by a factor of M, the magnitude of a compensation resistor 366 is made to be a factor of M larger than $R_{TERM}$ such that the compensation transistor 362 conducts a current $I_L/M$ at a drain voltage of $V_{OL}$.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A receiver interface circuit comprising:
an input logic gate of a predefined type for providing output signals in response to input signals in accordance with a first transfer characteristic governed by a reference voltage, wherein in accordance with said first transfer characteristic said input logic gate includes a first logical inverter for providing output signals of a first level in response to input signals less than a predefined threshold and for providing output signals of a second level in response to input signals greater than said predefined threshold; and
compensation means for adjusting said reference voltage, including a compensation gate of said predefined type having an output governed by said reference voltage, and feedback loop means connected between said compensation gate's output and said input logic gate for varying said reference voltage until said compensation gate generates a predefined output signal, said compensation gate being of a second transfer characteristic substantially identical to said first transfer characteristic; wherein said compensation gate's output is connected to an input of said compensation gate and wherein said compensation gate includes a second logical inverter substantially identical to said first logical inverter, said first and second logical inverters having trip points equivalent to said predefined threshold, and wherein said feedback means further includes:
a compensation source having a voltage magnitude equivalent to said predefined threshold, and
a differential amplifier having a first input connected to said compensation gate's output, a second input connected to said compensation source, and an amplifier output connected to a supply terminal of said compensation gate.

2. A driver interface circuit comprising:
input logic gate means for receiving input signals, said input logic gate means including a first logic gate of a predefined type having a first current transfer characteristic governed by a gate control voltage wherein in accordance with said first current transfer characteristic said first logic gate includes a first logical inverter for providing output signals of a first level in response to a first range of said input signals less than a predefined threshold and includes a second logical inverter for providing output signals of a second level in response to a second range of said input signals greater than said predefined threshold, said input logic gate means further including switch means for connecting said feedback line to a first control terminal of said first logic gate when input signals within said first range are received by said input logic gate means, and for connecting said first control terminal to a predefined gate control voltage when input signals within said second range are received by said input logic gate means; and compensation means for adjusting said gate control voltage, including a compensation gate of said predefined type having a current transfer characteristic proportional to said first current transfer characteristic, and feedback loop means connected between said compensation gate and said input logic gate for varying said gate control voltage until current flowing through said compensation gate matches a supply current provided to said input logic gate, said compensation means including a differential amplifier for impressing said gate control voltage on a feedback line, said amplifier including a first input connected to an output of said compensation gate and a second input connected to a predefined reference voltage of said first level.

3. The driver interface circuit of claim 2 wherein said first logic gate and said compensation gate comprise transistor of proportional dimensions, and wherein said feedback line is connected to a second control terminal of said compensation gate.

4. The driver interface circuit of claim 3 wherein a magnitude of said supply current corresponds to a ratio of said proportional dimensions.

5. In a driver interface circuit including a first logic gate of a predefined type having a first current transfer characteristic governed by a gate control voltage, said logic gate being of a first size, a method of reducing variation in said first current transfer characteristic comprising the steps of:

varying said gate control voltage until current flowing through a compensation gate of said predefined type having a current transfer characteristic proportional to said first current transfer characteristic matches a supply current provided to said first logic gate, said compensation gate being of a second size; and generating said supply current, wherein magnitude of said supply current is proportional to a predefined relationship between said first and second sizes.

6. A transceiver network comprising:
a receiver circuit, said receiver circuit including:
a CMOS input inverter that provides output signals in response to input signals in accordance with a first transfer characteristic governed by a first reference voltage, and first compensation means for adjusting said first reference voltage, including a first CMOS compensation inverter having an output governed by said first reference voltage, and first feedback loop means connected between said first compensation gate's output and said CMOS input inverter for varying said first reference voltage until said first compensation gate generates a predefined output signal; and a driver circuit, said driver circuit including:
an first MOS gate having a first current transfer characteristic governed by a gate control voltage, and second compensation means for adjusting said gate control voltage, including a second MOS gate having a current transfer characteristic proportional to said first current transfer characteristic, and second feedback loop means connected between said second MOS gate and said first MOS gate for varying said gate control voltage until current flowing through said second MOS gate matches a supply current provided to said first MOS gate.

7. The transceiver network of claim 6 further including resistive ladder means for generating a threshold reference voltage and a driver reference from a common supply voltage, said first feedback means further including:

a first differential amplifier having a first input connected to said first CMOS compensation inverter's output, a second input connected to said threshold reference voltage, and an amplifier output connected to a supply terminal of said first CMOS compensation inverter.

8. The transceiver of claim 7 wherein said second compensation means includes:
a differential amplifier for impressing said gate control voltage on a feedback line, said amplifier including a first input connected to an output of said second MOS gate and a second input connected to said driver reference voltage;
wherein variation in said common supply voltage induces said outputs of said first and second MOS gates to vary in a substantially identical manner.

9. A driver interface circuit comprising:
an MOS driver transistor having a first current transfer characteristic for impressing output signals on an output node in response to input signals, said MOS driver transistor having a first current transfer characteristic governed by a gate control voltage; and compensation means for adjusting said gate control voltage, including an MOS compensation transistor having a current transfer characteristic proportional to said first current transfer characteristic, and feedback loop means connected between said MOS compensation transistor and said MOS driver transistor for varying said gate control voltage until current flowing through said MOS compensation transistor matches a supply current provided to said MOS driver transistor.

* * * * *